United States Patent [19]

Hamre et al.

[11] Patent Number: 5,530,302

[45] Date of Patent: Jun. 25, 1996

[54] CIRCUIT MODULE WITH HOT-SWAP CONTROL CIRCUITRY

[75] Inventors: John D. Hamre, Plymouth; Denton G. Wicklund, Delano; Steven D. Barkley, Roseville, all of Minn.

[73] Assignee: Network Systems Corporation, Minneapolis, Minn.

[21] Appl. No.: 180,623

[22] Filed: Jan. 13, 1994

[51] Int. Cl.$^6$ ....................................................... H01J 13/00
[52] U.S. Cl. ............................................ 307/147; 395/280
[58] Field of Search ..................................... 395/325, 750, 395/800, 500; 361/58, 100, 118, 62; 439/377; 307/147

[56] References Cited

U.S. PATENT DOCUMENTS

| | | | |
|---|---|---|---|
| 3,993,935 | 11/1976 | Phillips et al. | 361/748 |
| 4,700,348 | 10/1987 | Ise et al. | 371/8.2 |
| 4,750,136 | 5/1988 | Arpin et al. | 364/514 B |
| 4,835,737 | 5/1989 | Herrig et al. | 395/325 |
| 4,999,787 | 3/1991 | McNally et al. | 364/514 B |
| 5,272,584 | 12/1993 | Austruy et al. | 361/58 |
| 5,277,615 | 1/1994 | Hastings et al. | 439/377 |
| 5,317,697 | 5/1994 | Husak et al. | 395/325 |

OTHER PUBLICATIONS

EDN–Product Update—dated Nov. 12, 1992.
Electronic Engineering Times article dated Jul. 20, 1992.

*Primary Examiner*—William M. Shoop, Jr.
*Assistant Examiner*—Jonathan S. Kaplan
*Attorney, Agent, or Firm*—Haugen and Nikolai

[57] ABSTRACT

A circuit board capable of live-insertion or hot-swapping into a live chassis backplane. The circuit board is provided with a power control circuitry for gracefully ramping up board power after insertion, or gracefully removing power just prior to physical removal of a circuit board from the board slot. A pair of ejector levers are provided on each side of the circuit board. A push button switch is provided proximate one ear thereof and is selectively opened or closed depending upon the position of an ejector cover which can be secured thereover in an interlocking relationship. Upon retraction of the extractor cover, the switch is opened, and the converse applies. Power MOSFETs are provided between the card edge and the board power busses which are gracefully turned on and off as a function of the switch position. A high-side gate driver provides an increased bias voltage, which bias voltage is communicated through the closed switch to the gates of the MOSFETs. An RC network is coupled to the MOSFET gate to determine the time constant at which bias voltage will be ramped up or ramped down to correspondingly ramp power up or down to the circuit board power busses. A power supply monitor circuit is also provided for automatically resetting the board upon a power up condition.

16 Claims, 6 Drawing Sheets

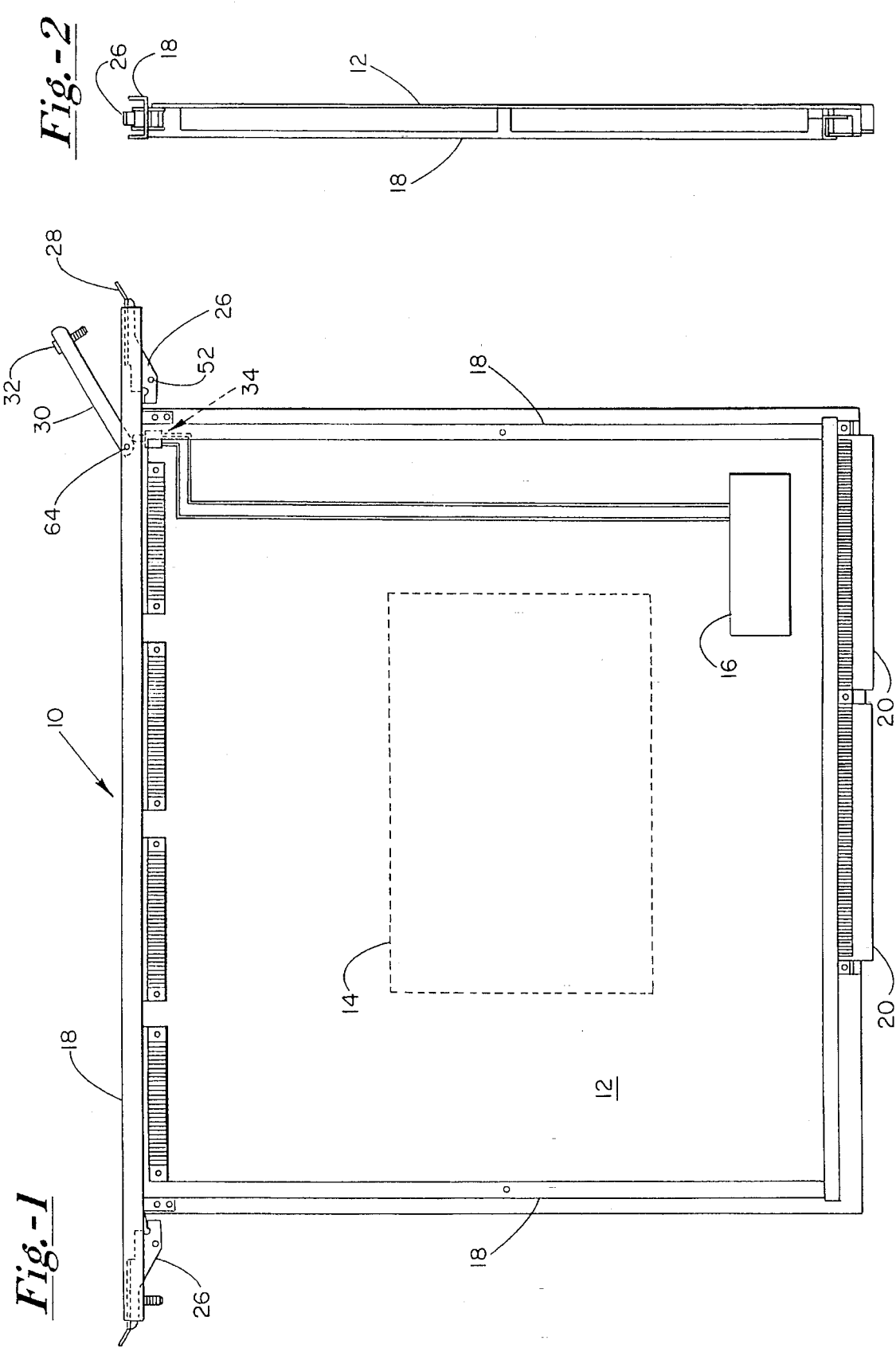

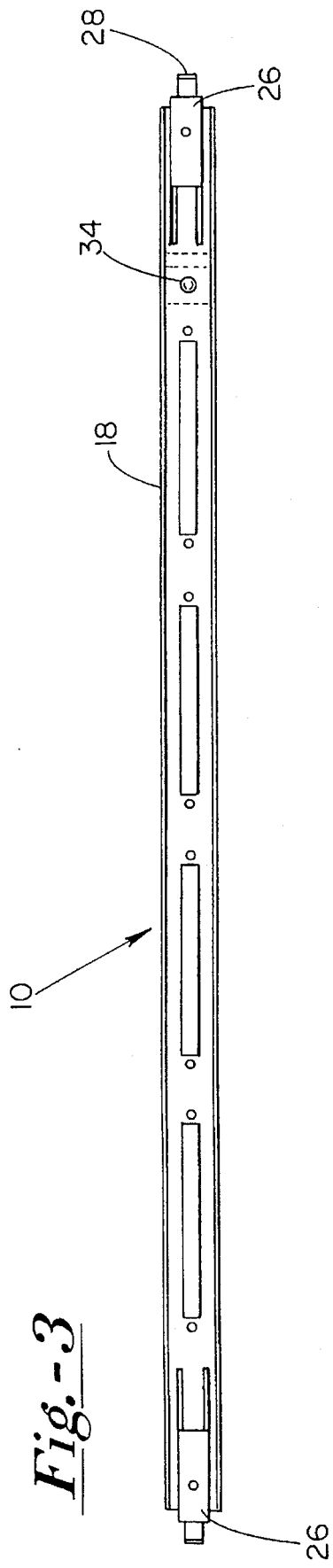

CIRCUIT MODULE WITH HOT-SWAP CONTROL CIRCUITRY

BACKGROUND OF THE INVENTION

I. Field of the Invention

This invention relates generally to the field of data communication systems, and more particularly to a logic circuit board used therein which can be inserted into and extracted from a backplane without removing power from the system, or interfering with data transfer in the system.

II. Description of the Prior Art

Data and network communication systems typically require a long up-time when initialized. This is particularly true when a large number of logic boards are connected and integrated into the system. Communication systems, in particular, also require a long period of time for initialization. These systems typically include a plurality of logic boards inserted into boards slots of a card cage, each card interfacing with an edge connector on a backplane or motherboard. Conventionally, to insert or remove a circuit board from the system backplane, the chassis would ordinarily be first powered down before insertion or removal of a circuit board. This has been necessary to avoid the sudden making or breaking of circuit connections, which tends to generate electrical noise on the backplane power bus and causing errors on the data bus. The reconfiguration and initialization of the system has necessitated long and inconvenient system down-time.

Recently, live-insertion of circuit boards into a card chassis, commonly referred to as "hot-swapping" the boards, has been explored. Standardized methodology through which a faulty board can be swapped out of a system, and a replacement board swapped in, while the system remains up and running is only now being established. Several vendors now offer live-insertion of circuit modules without damaging the module itself, or interfering with data communications of the system.

One such device is a hot extraction and insertion of logic boards in an on-line communication system, disclosed in U.S. Pat. No. 4,999,787 to McNally et al. and assigned to Bull H. N. Information Systems, Inc. A defective logic board can be replaced, or installed into the system, without powering down the system, by providing external auxiliary voltages and a reset signal to the board to put it in a passive state while it is being plugged into or unplugged from its backplane connector. This approach is the so-called umbilical cord approach. However, the idea of providing power to a circuit board removed from a chassis creates the possibility the circuit board will become damaged if it accidentally comes into contact with a metal surface resulting in a short. Further, the bus activity needs to be halted as a circuit board is inserted or removed from the backplane connector, thus making the system temporarily inoperable. Hence, this live-insertion technique is not transparent to the system.

U.S. Pat. No. 4,835,737 to Herrig, et al. and assigned to AT & T, teaches a method and apparatus for controlled removal and insertion of circuit modules. A latch activated switch provides a control signal in anticipation of circuit board removal. The control signal activates a finite state machine, which seizes control of the bus after completion of any current bus communications, and stops the generation of clock pulses normally required in bus communications. When contact is physically broken between the board and its corresponding connector, the finite state machine restores the bus clock pulses and relinquishes control of the bus. Similarly, when a board is to be inserted into a slot and connected to an open connector, contact between the board and the connector is sensed by the finite state machine which causes the bus to be seized and the bus clock pulses to be temporarily inhibited. When the board is fully inserted, the finite state machine restores the bus clock pulses and relinquishes control of the bus. This device is similar to the device taught by McNally et al., in that the system needs to be halted during the insertion or extraction process, thus rendering the system temporarily inoperative.

U.S. Pat. No. 4,750,136 to Arpin et al. and also assigned to AT & T, teaches a communication system having automatic circuit board initialization capability. A malfunctioning circuit board can be replaced while the system is operating, and the replacement circuit board is automatically initialized by the system using the stored operating parameters from the malfunctioning circuit board. However, these teachings are only generally related to auto-configuration.

U.S. Pat. No. 3,993,935 to Phillips et al. and assigned to the Xerox Corporation, teaches a printed circuit board connection in which some contacts on the board edge are recessed slightly from the edge so that certain electrical connections may be made prior to the others. However, when the circuit board power busses eventually make contact with the backplane power bus, a surge of power is generated on the circuit board, which causes noise on both the backplane power bus and the circuit board power bus. This noise is a primary source of data errors of the system. There is no graceful application or removal of power to and from the circuit board module, and this board is not suitable for live insertion in a card-cage chassis.

While each of these devices provide a live-insertion or "hot-swapping" capability of the circuit card modules, none allows for hot-swapping circuit cards in a way that is transparent to the system, i.e. does not temporarily halt data bus communications, or does not require modification of the backplane, and which allows for insertion and extraction of circuit board modules without first performing initial steps.

OBJECTS

It is accordingly a principle object of the present invention to provide a method and apparatus for live-insertion or "hot-swapping" of circuit board modules.

It is a further object of the present invention to provide hot-swapping modules for digital systems which can be inserted and removed without interrupting data bus communications of the system.

Another object of the present invention is to provide hot-swapping of circuit board modules such that the module can be simply inserted or extracted from its board slot without first entering software commands in anticipation of the associated circuit change.

Still yet another object of the present invention is to provide a circuit board module which can be hot-swapped without creating errors on the backplane data bus during insertion or extraction of the module therefrom.

Still yet a further object of the present invention is to provide a circuit board module which can be hot-swapped by simply inserting or extracting the board in a conventional manner, and wherein auto-reconfiguration is automatically provided.

Other objects, features and advantages of the present invention will become apparent to those skilled in the art through the Description of the Preferred Embodiment, claims, and drawings herein wherein like numerals refer to like elements.

SUMMARY OF THE INVENTION

The foregoing objects and advantages of the present invention are achieved by providing a circuit board module which can be hot-swapped due to the incorporation of a power control circuit on the circuit module itself. The power control circuitry gracefully, i.e. in a smooth and gradually increasing or decreasing ramped fashion, applies and removes power from between the backplane power bus and the circuit module power bus over a predetermined time period, thus precluding the introduction of transient noise on the bus. More specifically, the power control circuit smoothly and gradually ramps up the power to the circuit module power bus once inserted, or smoothly and gradually ramps down the power just prior to extraction and removal of the circuit module from the backplane.

The circuit module comprises a circuit board having at least one board power bus. The circuitry on this circuit board is powered by the board power bus. A control mechanism is disposed on the circuit board for automatically generating a first output signal when a board is either to be plugged into or extracted from its backplane. A power control circuit is responsive to this first output signal and is electrically coupled to the board power bus. This power control circuit gracefully applies power to or removes power from the backplane main power bus and the circuit module board power bus as a function of the first output signal. Thus, error-producing noise will not be generated on the backplane power bus, and data communications will not be degraded, when the board is live inserted or removed.

In the preferred embodiment, the circuit module has at least one board ejector in the form of a cam that reduces the forces needed to insert a card into its backplane connector or to remove the card therefrom. An ejector cover is provided for normally shielding one of the ejectors, preventing its actuation, and forms an interlock. The control mechanism for generating the first output signal is responsive to the position of the ejector cover. More specifically, the control mechanism comprises a push button switch disposed between the ejector cover and the ejector itself. This switch is closed when the cover is shielding the board ejector, but opens when the ejector cover is retracted to make the ejector accessible to a service person. When the ejector cover is retracted to open this switch, the power control circuit responsively and gracefully ramps down and turns off the power to the circuit board power busses over a predetermined time. Thus, when the extractors are subsequently manipulated to retract the board from its slot, the live backplane power has already been removed from the circuit module. Hence, physical removal of the circuit module from its slot and the backplane will not cause noise on the backplane power bus. Accordingly, the remaining circuit modules comprising the digital system can remain up and running, without the necessity of temporarily halting data bus communications on the backplane. A proximity sensor/switch disposed at the card edge proximate the backplane could be used in lieu of this push button switch. This proximity switch would close after the board was physically connected to the backplane upon insertion, and would open before the board was physically disconnected from the backplane when removed.

In the preferred embodiment, the power control circuit includes a plurality of MOSFETs. These MOSFETs are controllably turned on or off in response to the first output signal generated by the push button switch disposed under the ejector cover. One terminal of each MOSFET, such as the drain, is coupled to the board edge and interfaces with the backplane power bus when the circuit module is inserted into the slot and connected thereto. Another terminal of each MOSFET, such as the source, is electrically coupled to one of the circuit board power busses. The closure of the switch disposed under the ejector cover causes the first output signal, or bias voltage, to be coupled to the gate of each MOSFET. An RC network is provided at each MOSFET gate to ramp the bias voltage up or down, to in turn correspondingly ramp the power to the circuit board power busses up or down through the MOSFET, via the drain-to-source electrodes. The speed at which the MOSFET is turned on or off is established by selectively choosing the RC time constant. When the circuit board module is inserted into a respective board slot and secured using the ejector handles, upon securing the ejector cover over the respective ejector, the push button switch thereunder is closed to consequently cause the power control circuit to ramp up the power to the circuit module power busses. This insures that the power will not be prematurely applied to the card before it is fully inserted into its backpanel edge connector.

Power MOSFETs having a very low drain-to-source resistance are provided to apply power between the circuit card edge and the circuit module power bus to minimize the dissipation of power and the generation of heat, and to minimize the voltage drop across the drain-to-source device. MOSFETs having drain-to-source resistances as low as 7 milliohms are now available for such purposes. As only +5 volts and −5 volts are generally available from a backplane, a high-side gate driver is utilized for creating a bias voltage of about +15 volts. This bias voltage is then applied to the gate of the MOSFETs when the cover actuated switch is closed to fully turn on the MOSFETs, thus realizing a minimal drain-to-source resistance.

The present power control circuitry can be incorporated on any circuit board to make it suitable for live insertion, i.e. hot-swapping. The backplane and system need not be powered down or bus communications halted, nor is any modification of the backplane required. Further, the circuitry is not complex, and is relatively inexpensive.

BRIEF DESCRIPTION OF THE DRAWINGS

FIG. 1 is a side elevational view of a circuit board module having an ejector at each side thereof, an ejector cover retractable from one ejector, and a push button switch disposed between the ejector cover and the board frame proximate the ejector in an interlocking relationship, which switch initializes the power up or power down of power to the circuit module power busses as a function of the ejector cover position;

FIG. 2 is an end elevational view of the circuit module shown in FIG. 1 with the ejector cover removed;

FIG. 3 is a top view of the circuit module shown in FIG. 1 with the ejector cover removed from the board frame to illustrate the location of the push button switch proximate the right ejector handle;

DESCRIPTION OF THE PREFERRED EMBODIMENT

Figure 4:
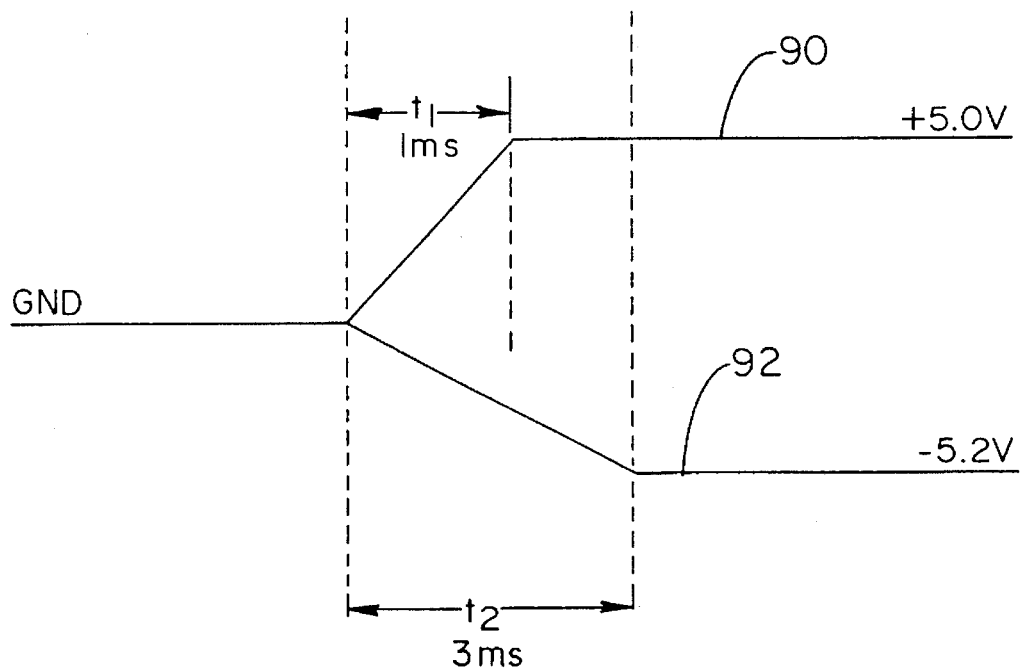
FIG. 4 is a graphical illustration of gracefully bringing power up to the circuit board module power busses, wherein the positive and negative voltage rails are ramped from ground.

Referring now to FIG. 1, a circuit board module 10 which is suitable for live insertion or hot-swapping from a live system backplane is shown. Module 10 is preferably a circuit board module adapted for hot-swapping from a data switching system suitable for networking high-speed data. Circuit module 10 is seen to include a circuit board 12 with circuitry 14 disposed thereon, and which may include surface mounting technology. A power control circuit 16 is also disposed on board 12 proximate the card edge connectable to a system backplane. Module 10 includes a rigid steel frame 18 extending about the periphery thereof. One or more card edge connectors 20 are provided to interface data and power from circuitry 14 and 16 to a system backplane 22. (See FIG. 7).

Module 10 is further seen to include a pair of ejector ears 26 each pivotably coupled to opposing ends of upper frame member 18. Each ejector ear 26 includes a thumb tab portion 28 for providing a handle when pivoting the respective ejector, such as when inserting or ejecting circuit module 10 from a respective card slot. Each ear 26 includes a cam shaped hook for engaging a mating area on a card cage into which the cards are inserted. The module 10 described thus far, with the exception of power control circuit 16, is well known in the art. Switching module number HDO40B manufactured by Network Systems Corporation of Minneapolis, Minn., the assignee of the present invention incorporates this type of ejector arrangement.

In accordance with the present invention, an injector cover 30 is pivotably coupled to the upper frame member 18 and is adapted to selectively cover or expose the right ejector 26 shown in FIG. 1. Ejector cover 30 can be secured in a closed covering relation about respective ejector ear 26 by securing a fastener 32 disposed therethrough into the card cage frame of the system (not shown). As will be appreciated shortly, a momentary push button or plunger-type single pole single throw (SPST) switch 34 is provided proximate the right ejector 26 and is secured to board 12 with a 90° mount. Switch 34 is operated by manually retracting or closing ejector cover 30 to expose or cover switch 34 and respective ejector ear 26. This occurs prior to physical retraction and insertion of circuit module 10 from its backplane. Opening of ejector cover 30, as shown, serves to allow the push button switch 34 to open. Closure of cover 30 over its ejector ear 26 depresses the push button 38 of switch 34 to cause a closure thereof (see FIG. 6). The closure or opening of switch 34 is sensed by power control circuitry 16 via a pair of circuit board etches 36.

Figure 5:
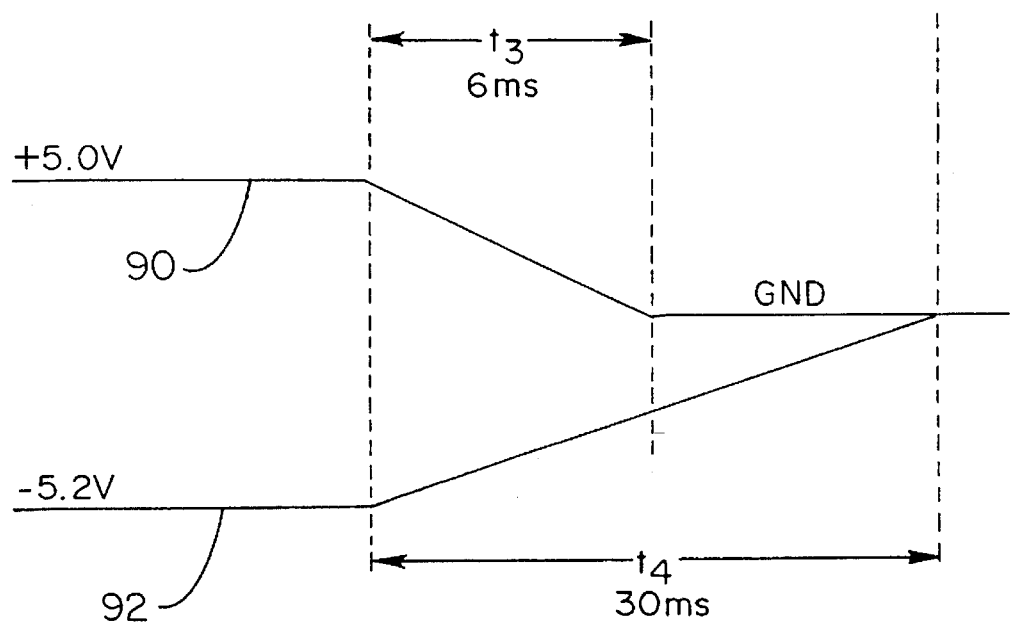
FIG. 5 is a graphical representation of the graceful ramped powering down of the positive and negative voltage rails to ground.

In operation, the state of push button switch 34 is sensed by power control circuitry 16 to gracefully connect or disconnect the power from the backplane power bus to the circuit board power bus. That is to say, the power from the backplane power bus is applied to or removed from the circuit board power bus in a smooth and gradually increasing or decreasing ramped fashion over a predetermined time period depending on the state of push button switch 34. By way of illustration and in reference to FIGS. 4 and 5, power is gracefully applied to the board power busses and thus circuitry 14 of module 10 by closure of switch 34, upon closure of ejector cover 30. As shown in FIG. 4, the positive voltage rail and the negative voltage rail gracefully ramp from ground to the full specified voltage over time windows $T_1$ and $T_2$, which may, for example, be about one millisecond for $T_1$ and three milliseconds for $T_2$. Similarly, as shown in FIG. 5, the opening of switch 34 by retracting ejector cover 30 will be sensed by circuitry 16. Consequently, both the positive and negative power rails gracefully ramp down to ground over time windows $T_3$ and $T_4$, which may be approximately six milliseconds for $T_3$ and thirty milliseconds for $T_4$. Thus, a manual and semi-automatic power connect and disconnect feature is provided which allows live insertion or hot-swapping of circuit module 10 into a card slot of a live system.

Once the board is inserted into its card cage slot such that connectors 20 are accurately aligned with the respective connectors of the backplane 22, rotation of ejector handles 26 forces the connector elements together to secure module 10 in place. The cam shaped hooks of the ejectors grip the rail of the card cage so that rotation of the ears translates the card. Then, ejector cover 30 can be closed and secured into place using fastener 32 causing switch 34 to close. Moreover, upon full insertion and replacement of ejector cover 30, powering-up of circuit module 10 takes place. Power control circuitry 16 senses the power-up of the board power bus and causes circuitry 14 to reset. Due to the routine polling of the circuit module within the chassis, autoreconfiguration can be incorporated in software as well upon insertion or removal of circuit module 10.

Similarly, prior to retraction or removal of module 10 from the card slot, ejector cover 30 must first be retracted by first loosening fastener 32. Switch 34 is exposed and opened upon lifting of cover 30. This is sensed by power control circuitry 16. Then, power will be gracefully disconnected from the circuit board power busses, over a predetermined period of time as graphically illustrated in FIG. 5, before the ejectors can be actuated to remove the card. The remaining circuit modules in the card cage (not shown) can remain active and running, and do not need to be temporarily halted. Thus, live insertion or hot-swapping of the circuit module 10 is transparent to operation of the other circuit modules.

Figure 6:
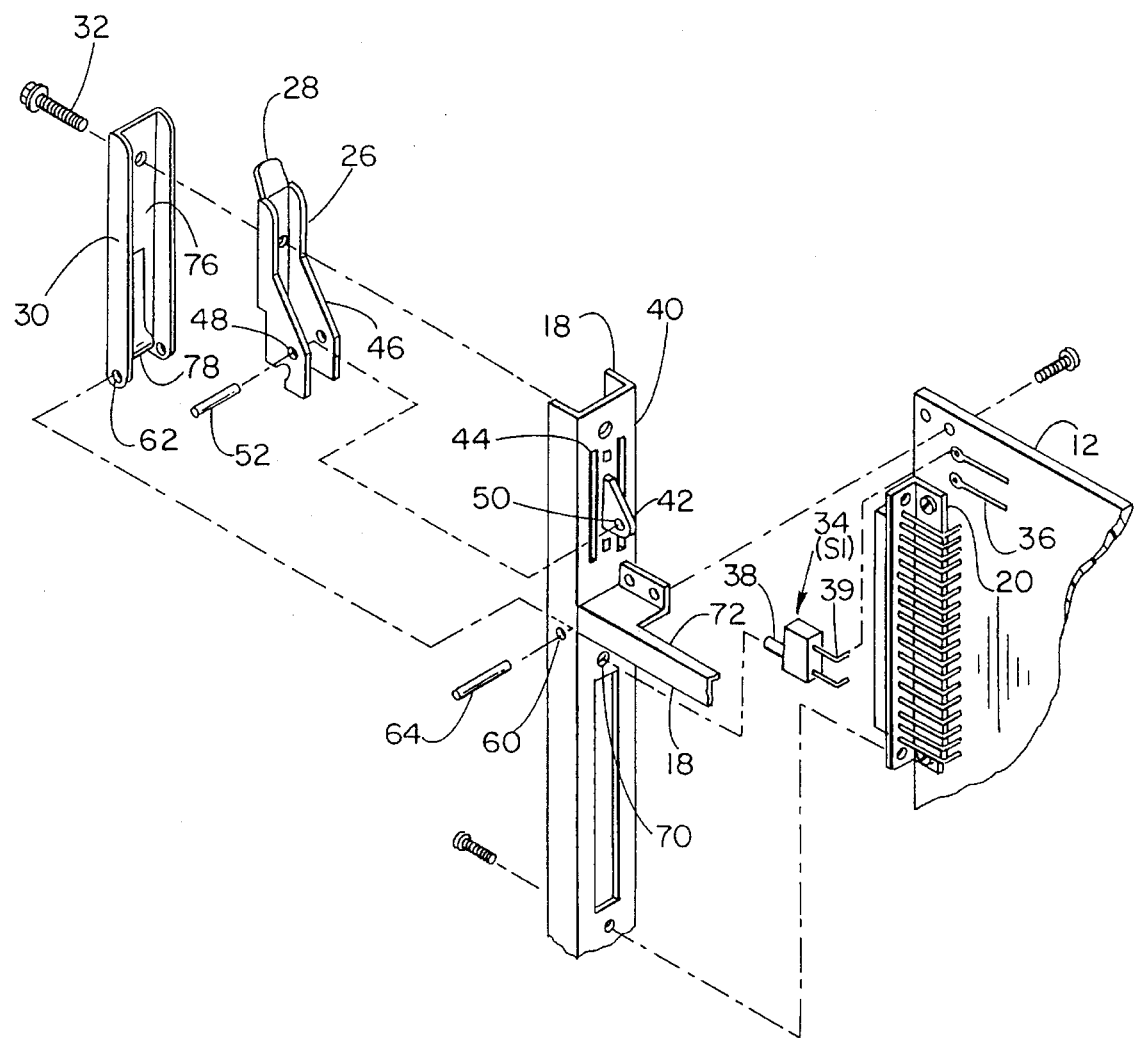
FIG. 6 is an exploded perspective view of the ejector cover and corresponding ejector handle portion shown in FIG. 1, which ejector cover operates the opening and closure of the push button switch to responsively ramp up or ramp down power to the circuit module power busses depending upon the position of the ejector cover.

Turning now to FIG. 6, an exploded perspective view of the novel switch and ejector cover assembly of FIG. 1 is shown. The upper frame member 18 is seen to include a flanged or extending portion 40. Extending portion 40 includes a generally triangular-shaped tab 42 extending therefrom between a pair of parallel longitudinal openings 44. Ejector ear 26 is generally channel-shaped, and has a pair of side wall portions 46 adapted to be disposed through one of the respective openings 44 in close tolerance therewith. Each side member 46 includes a small opening 48 defined therethrough. Tab portion 42 also includes a corresponding small opening 50. A pivot pin 52 holds the ejector ear to the tab 42 to facilitate rotation of ejector handle 26 through elongated openings 44 and about pivot pin 52.

Still referring to FIG. 6, top frame member 18 is seen to have a generally U-shaped cross section with a small aperture 60 formed through each side wall thereof proximate side frame member 18. Ejector cover 30 is seen to include a corresponding pair of apertures 62 defined through the side wall of the ejector cover 30 at a proximal end thereof. A pivot pin 64 is inserted through both openings 62 of ejector cover 30, and is fixedly disposed through openings 60 in top frame member 18 to facilitate pivotable rotation of ejector cover 30 thereabout.

Push button switch 34 is adapted to be inserted through an aperture 70 located proximate to and inside side frame member 18. Switch 34 is secured within opening 70 with the push button 38 extending outwardly, and the terminal connections 39 extending downwardly and bending 90° to mount to board 12. The pair of etches 36 are electrically coupled to each of the two contacts of switch 34 at terminals 39, and extend downwardly to power control circuitry 16, as shown in FIG. 1. Upon closure of ejector cover member 30 over the ejector 26, a spring finger 78 disposed on an inside surface 76 thereof engages the push button 38 of switch 34 causing it to close.

Figure 7:
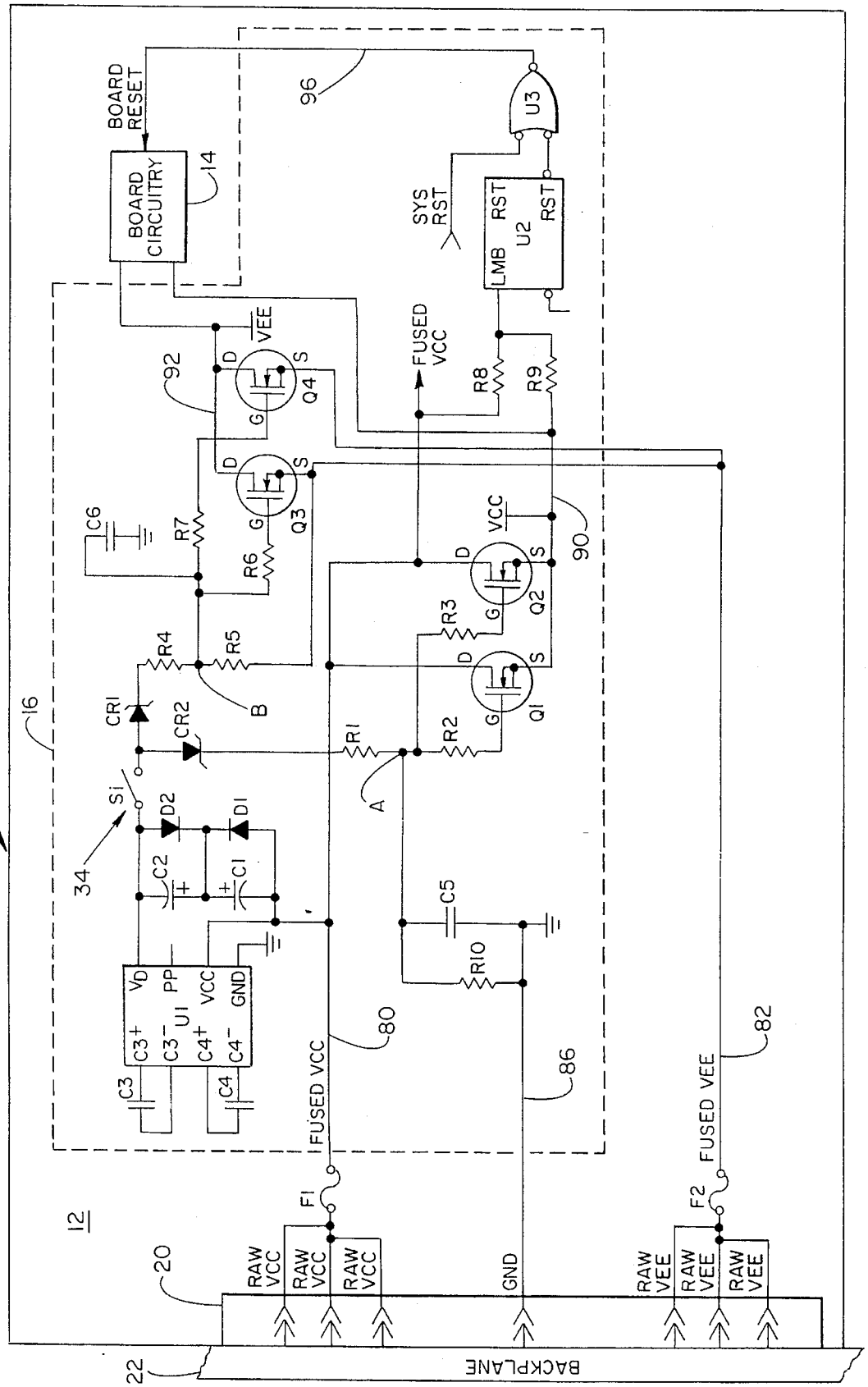
FIG. 7 is a schematic drawing of the circuitry that gracefully applies power to or removes power from the circuit board power busses.

Turning now to FIG. 7, a schematic representation of power control circuitry 16 is shown and will be discussed in detail. As shown, the raw fused power is routed from backplane 22 via connector 20 to power control circuitry 16 through fuses F1–F2. A fused VCC power bus 80 extends from backplane 22 to the circuitry 16 as shown, and a fused VEE power bus shown at 82 also extends from backplane 22, via connector 20, to power control circuitry 16 as well. Fused VCC power bus 80 busses +5 volts to circuitry 16 and serves as a positive rail, and power bus 82 busses −5.2 volts to circuitry 16 and serves as the negative rail. A ground bus is provided at 86.

First, to provide an overview to power control circuitry 16, circuitry 16 includes a bias voltage generator in the form of a high-side gate driver shown as microcircuit U1. High-side gate driver U1 provides a large bias voltage to the gates of a plurality of power MOSFETs upon closure of switch 34, also labeled S1. Upon closure of switch S1, this large bias voltage is consequently applied to the gates of each power MOSFET, via a series resistor, to turn on each of the MOSFETs. Upon turning on each MOSFET, the raw fused power provided on busses 80 and 82 are gracefully applied to a circuit board VCC bus 90 and a VEE bus 92. An RC network at the gates of each MOSFET controls the time periods $T_1$–$T_4$ over which the bias voltage is ramped to the gate of each of the MOSFETs, thus correspondingly establishing the rate at which power is ramped to circuit board VCC bus 90 and VEE bus 92.

Now, with particular reference to power control circuitry 16 shown in FIG. 7, it is seen to include a high-side gate driver U1 electrically coupled to capacitors C1, C2, C3 and C4. Gate driver U1 receives the raw fused +5 volt potential to the pin designated VCC, and outputs a bias voltage of approximately +15 volts at the pin designated $V_D$. Gate driver U1 preferably comprises a microcircuit identified as part number MAX622 manufactured by the Maxim Corporation of Sunnyvale, Calif. Capacitors C1, C2, C3 and C4 serve as charge pumps for microcircuit U1. Capacitors C1 and C2 are preferably electrolytic capacitors each having a capacitance of about 33 microfarads. Capacitors C3 and C4 each preferably have a value of about 0.047 microfarads. Back-to-back diodes D1 and D2 are provided across capacitors $C_3$ and $C_4$ to provide reverse voltage protection to these devices.

Upon closure of switch 34 by closure and fastening of ejector cover 30 to the frame, the +15 volt bias voltage provided by gate driver U1 is fed, via a pair of Schottky diodes labeled CR1 and CR2, to the gate of each of MOSFETs Q1, Q2, Q3 and Q4. A resistor R1 is provided in series between Schottky diode CR2 and node A. A pair of further resistors R2 and R3 is provided, one resistor being in series between node A and each respective gate, labeled G, of MOSFETs Q1 and Q2 as shown. A resistor R10 is provided between node A and ground. MOSFETs Q1 and Q2 each have their drain terminal, labeled D, electrically coupled to the raw fused VCC bus 80, as shown. The source terminal, labeled S, of each MOSFET Q1 and Q2 is coupled to one another and to VCC bus 90, as shown. Thus, MOSFETs Q1 and Q2 are in parallel with one another.

Each MOSFET Q1 and Q2 is turned on by application of the +15 volt bias voltage to its gate from gate driver U1, via closed switch S1. MOSFETs Q1 and Q2 begin to turn on when the voltage potential from gate-to-source of the respective MOSFET reaches about +5 volts. When the bias voltage reaches +15 volts at each gate terminal, the gate-to-source potential is +10 volts, and each MOSFET Q1 and Q2 is fully turned on. When fully turned on, the resistance between the source and drain terminals of each MOSFET is as low as 7 milliohms. Accordingly, there is little power dissipation and heat generated when power is conducting between the source and drain terminals, and a minimal voltage drop from drain to source is created.

Each of MOSFETs Q1 and Q2 is gracefully turned on due to the RC network comprised of resistors R1 and R10, and capacitor C5. Upon closure of switch S1, the bias voltage will gradually charge capacitor C5, depending on the RC time constant established by the resistance value of R1 and R10, and the capacitance of C5. Accordingly, the bias voltage applied to the gates of each MOSFET Q1 and Q2 will ramp from 0 volts to +15 volts while the voltage provided to bus 90 will ramp from 0 volts to +5 volts.

Similarly, the +15 volt bias voltage is provided to node B via Schottky diode CR1 and series resistor R4 upon closure of switch S1. A resistor R5 is coupled between node B and the negative fused power bus 82. Resistors R4 and R5 together provide a voltage divide network such that upon closure of switch S1, a bias voltage of +5 volts is seen at node B. A pair of series resistors R6 and R7 is provided in series between node B and the gate terminal of respective MOSFETs Q3 and Q4. The source terminal of each MOSFET Q3 and Q4 is tied to the negative power bus. The drain of each MOSFET Q3 and Q4 is tied to one another and to circuit board VEE bus 92. The +5 volt bias voltage at node B is applied to the gates of each MOSFET Q3 and Q4. The potential at the source terminal of each MOSFET Q3 and Q4 is −5.2 volts, such that a potential of approximately 10 volts is seen between the gate and source of each MOSFET. Accordingly, each MOSFET Q3 and Q4 is also turned on upon by the bias voltage closure of switch S1. Consequently, the negative power rail on bus 82 is electrically coupled to circuit board VEE bus 92 via the source-to-drain of each MOSFET. As shown, each MOSFET Q3 and Q4 is in parallel with one another as well.

An RC network is also associated with MOSFETs Q3 and Q4, similar to the RC network comprised of resistor R1 and R10, and capacitor C5 associated with MOSFETs Q1 and Q2. Specifically, resistors R4 and R5 in combination with capacitor C6 provide an RC time constant for the bias voltage applied to the gate of each MOSFET Q3 and Q4. Upon closure of switch S1, the bias voltage at node B, and consequently the gates of each MOSFET, will ramp from −5.2 volts to approximately +5 volts. The voltage at the source terminal of each MOSFET Q3 and Q4 will remain at −5.2 volts, and thus, a potential of approximately 10 volts will eventually be realized between the gate and source terminals of each MOSFET. The values of the RC network establish the rate at which the bias voltage from U1 will ramp up to +5 volts to turn on each MOSFET. For example, with the 100K ohm values chosen for resistors R4 and R5 and 0.1 microfarads for capacitor C6, and 22K ohms chosen for resistor R1, 1M ohms chosen for resistor R10, and 0.1 microfarads chosen for capacitor C5, each of MOSFETs Q3 and Q4 will begin to turn on during $T_2$ at approximately 3 milliseconds, and MOSFETS Q1 and Q2 will begin to turn on during $T_1$ at approximately 1 millisecond, when the gate-to-source potential reaches +5 volts. When each MOSFET Q1–Q4 is fully turned on, the resistance between each respective drain and source terminal is approximately 7 milliohms. Thus again, very little power dissipation and heat is generated when each MOSFET is fully turned on, and the voltage drop across the drain-to-source terminals is minimal.

Similarly, when switch S1 is opened upon removal of the fastener and lifting of the ejector cover 34, the bias voltage from U1 will be removed from the gate of each MOSFET and each MOSFET will be turned off. The rate at which the bias voltage applied to each gate is removed is also determined by the respective RC network, and may be approximately six milliseconds for $T_3$ and thirty milliseconds for $T_4$. Thus, the bias voltage will be ramped down to ground causing the potential at each board power bus 90 and 92 to also ramp down to ground, as shown in FIG. 5. Again, a graceful power disconnect over a predetermined true interval is realized.

As can be readily appreciated, by changing the values of resistors and capacitors forming the RC networks for each pair of MOSFETs Q1 and Q2, and Q3 and Q4, the speed and rate at which the MOSFETs are turned on and off, and ultimately the rate at which power is gracefully applied or removed from the corresponding board busses 90 and 92, can be determined. This period is always short compared to the time required for a service person to grasp and remove a board following displacement of the ejector cover. One principle feature of the present invention is that due to the RC networks, the bias voltage to the MOSFET gate will ramp up or down depending on the closure or opening of switch S1, such that the voltage realized at circuit board busses 90 and 92 will correspondingly ramp up or down as well in a graceful manner. Thus, there is no sudden application or removal of power from circuit module busses 90 and 92, which busses ultimately power board circuitry 14 as shown. Consequently, no noise will be generated on power busses 80 and 82. These busses are coupled to the backplane power busses, and a circuit module 10 operating in the system can continue to operate uninterrupted and without generating data errors.

One further feature of the control circuit of the present invention is provided by a power supply monitoring microcircuit U2 which may be a type 701CPA integrated circuit sold by Maxim Corporation. The voltage from board VCC bus 90 and the raw fused VCC bus 80 are summed through resistors R8 and R9 and provided to LMB input of microcircuit U2. Microcircuit U2 senses the ramping up of voltage on bus 90 and removes or de-asserts the reset (RST) for a predetermined time after terminal detection of this ramped voltage, such as for 200 milliseconds. Specifically, when S1 is open, the voltage at the LMB input is 2.5 volts due to the voltage divide of R8 and R9 between raw VCC and bus 90, which is pulled to ground by board circuitry 14. Upon closure of switch S1, when each MOSFET Q1 and Q2 starts to turn on, the voltage at the LMB input initially remains at 2.5 volts due to the voltage divide. As MOSFETs Q1 and Q2 are fully turned on, this voltage ramps up to +5 volts and is detected by power supply monitoring circuit U2. Upon detection of this voltage exceeding a predetermined threshold, such as +4.65 volts, the reset terminal is de-asserted after 200 milliseconds at the RST terminal of U2. A NOR gate U3 has one input tied to a SYS RST line, and has the other input tied to the RST terminal of microcircuit U2. The de-assertion of the RST terminal of microcircuit U2 tied to NOR gate U3 generates a board reset to board circuitry 14 on line 96. Thus, when switch S1 is closed and power is gracefully applied to board power rails 90 and 92, microcircuit U2 senses this ramping up of voltage and automatically generates a reset which is coupled via NOR gate U3 to board circuitry 14 so that a board reset operation is undertaken.

With no limitation intended, the components illustrated in FIG. 7 may have the following values, such values providing an operative embodiment of the invention.

$R_1$ - - - 22K ohms $R_2$, $R_3$, $R_6$, $R_7$ - - - 1K ohm $R_4$, $R_5$ - - - 100K ohms $R_8$, $R_9$ - - - 51 ohms $R_{10}$ - - - 1M ohm $C_1$, $C_2$ - - - 33 µf $C_3$, $C_4$ - - - 0.047 µf $C_5$, $C_6$ - - - 0.1 µf Auto-reconfiguration can also be realized in this present invention in that a system master controller (not shown) can continuously poll the board circuitry 14 of circuit module 10 to determine if the board is up and ready. Such auto-reconfiguration techniques are well known in the art.

In summary, a novel power control circuitry is provided which facilitates live or hot-swapping of a circuit module to a powered data communication backplane. Power is gracefully applied and removed from the circuit module power busses in response to the closure or opening of a single switch provided under an ejector cover. Power is gracefully applied or removed due to the implementation of the RC networks at the gates of each MOSFET. Operation of the remaining circuit modules in the card cage do not need to be temporarily halted during the hot-swapping of a circuit module according to the preferred embodiment of the present invention. Further, the graceful ramping of the voltages up and down insures that no noise is generated on the power busses extending on the backplane. Thus, no data errors are generated in circuit modules already operating with the backplane.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

For instance, other forms of switches besides MOSFETs could be incorporated such as power bipolar transistors, etc., and limitation to MOSFETs is not to be inferred. However, MOSFETs are preferred because they a solid state, can conduct a large current, have a very low "on" resistance between switched terminals and generate little power dissipation, and have a low voltage drop across the switched terminals when conducting. Further, a single switch (MOS- FET) for conducting power to each board power bus could be employed, and limitation to a plurality of switches (MOSFETs) in parallel is not to be inferred. A switch which is manually activatable at the card edge, without the additional feature of an ejector cover, is also contemplated by the present invention. The time required to lift the ejector cover, grasp and actuate the ejector levers and remove a card is much greater than the ramp down time of the bus voltages. Likewise, the replacement board must be fully inserted before the ejector cover can be closed to close the control switch and apply the ramped-up potentials to the power bus. Hence, the generation of transient noise is precluded.

Figure 8:
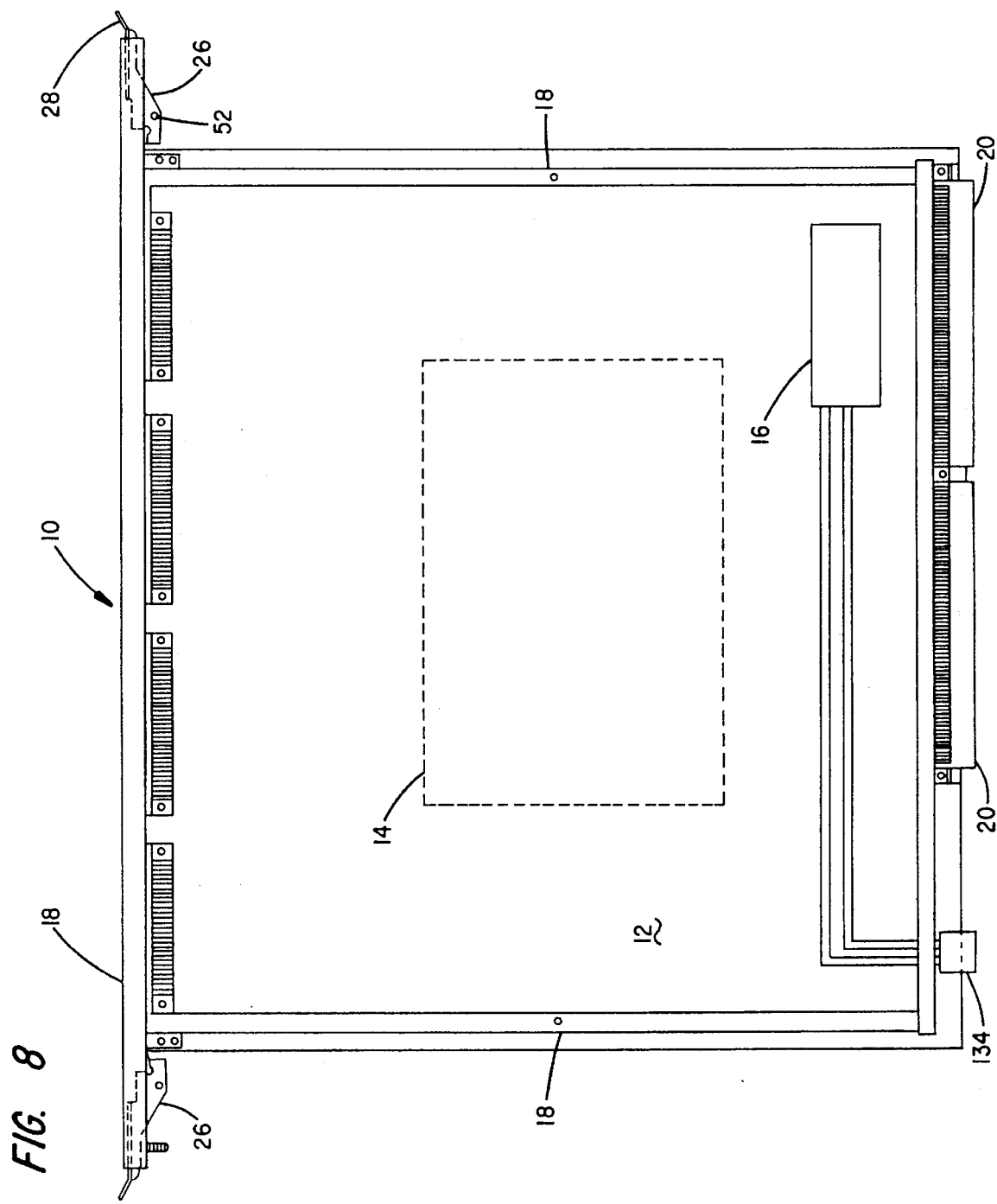
FIG. 8 is a side elevational view of a circuit board module of a second embodiment of the present invention, the circuit board module having a proximity switch disposed near the rear edge thereof for initiating the application and removal of power to the circuit board module power busses depending upon the position of the circuit board module with respect to the backplane.

Moreover, any number of commercially available proximity switches, could be used in place of switch 34 to automatically sense the proximity of board 12 to backplane 22. For instance, as shown in FIG. 8, an optical proximity switch 134 may be employed proximate the rear edge of circuit module 10 to detect the position of circuit module 10 with respect to backplane 22. Proximity switch 134 closes after the backplane bus is physically coupled to board connector 20 during insertion, to initiate the smooth and gradual ramped application of power between the backplane power bus and the circuit board power bus but is opened before connector 20 is physically disconnected from backplane 22 to initiate a ramp-down of power during removal of module 10. This may be accomplished by sensing the degree to which connectors 20 have engaged with the backplane connectors (not shown). To explain further, proximity switch 134 is capable of being powered up upon a fractional engagement of connectors 20 and backplane 22 to begin detecting the distance between backplane 22 and circuit module 10 during the remainder of the insertion process. Upon the detection of a predetermined distance between backplane 22 and circuit module 10 during insertion, proximity switch 134 closes to initiate the smooth and gradual ramped application of power between the backplane power bus and the circuit board power bus. Likewise, proximity switch 134 is capable of detecting a fractional disengagement of backplane 22 and connectors 20 to smoothly and gradually remove the power between the backplane power bus and the circuit board power bus prior to the removal of circuit module 10 from backplane 22. Power control circuitry 16 is responsive to proximity switch 134 as described with a reference to switch 34.

We claim:

1. A circuit module adapted to be electrically coupled to a live backplane having a main power bus, comprising:

(a) a circuit board having at least one board power bus;

(b) circuitry disposed on said circuit board and coupled to said at least one board power bus;

(c) control means disposed on said circuit board for generating a first output signal and a second output signal; and (d) power control means electrically coupled to said board power bus for applying power between said main power bus and said board power bus in a smooth and gradually increasing ramped fashion over a predetermined period of time in response to said first output signal and for removing power between said main power bus and said board power bus in a smooth and gradually decreasing ramped fashion over a predetermined period of time in response to said second output signal, whereby the power and any concurrent data operations on said main power bus remain uninterrupted and unaffected during said applying and removing power between said main power bus and said board power bus.

2. The circuit module as specified in claim 1 wherein said circuit board has at least one manually operated board ejector lever disposed thereon, at least one ejector cover swingably attached to said circuit board and disposed proximate said ejector lever for selectively exposing and covering said ejector lever, and wherein said control means includes a switch disposed in cooperating relationship with said ejector cover such that said switch generates said first and second output signals responsive to the swingable position of said ejector cover relative to said ejector lever.

3. The circuit module as specified in claim 1 wherein said control means includes a proximity switch disposed proximate a rear peripheral edge of said circuit board for detecting the position of said circuit module relative to said backplane during the insertion of said circuit module into said backplane to generate said first output signal and for detecting the position of said circuit module relative to said backplane during the removal of said circuit module from said backplane to generate said second output signal.

4. The circuit module as specified in claim 2 wherein said power control means is disposed on said circuit board and comprises at least one transistor for applying power between said backplane main power bus and said board power bus as a function of said first and second output signals.

5. The circuit module as specified in claim 4 wherein said power control means further comprises a high side gate driver coupled to said backplane main power bus when said circuit board is coupled to said backplane for providing a bias voltage to said transistor which is greater than the voltage on said backplane main power bus.

6. The circuit module as specified in claim 5 wherein said transistor is comprised of a MOSFET having a gate and said high-side gate driver couples said bias voltage to said MOSFET gate.

7. The circuit module as specified in claim 6 further comprising an RC network connected between said high-side gate driver and said MOSFET gate for establishing a ramping of said bias voltage.

8. A circuit module adapted to be electrically coupled to a live backplane having a main power bus and a data bus, comprising:

(a) a circuit board having at least one board power bus;

(b) circuitry disposed on said circuit board and coupled to said board power bus;

(c) an ejector lever coupled to said circuit board for facilitating insertion and removal of said circuit board into and from said backplane;

(d) control means disposed on said circuit board for generating a first output signal and a second output signal;

(e) a cover swingably coupled to said circuit board for selectively shielding said ejector lever and said control means, wherein said control means generates said first and second output signals as a function of the swingable position of said cover relative to said control means; and (f) power control means responsive to said first and second output signals and electrically coupled to said board power bus for applying power between said main power bus and said board power bus in a smooth and gradually increasing ramped fashion over a predetermined period of time responsive to said first output signal and for removing power between said main power bus and said board power bus in a smooth and gradually decreasing ramped fashion over a predetermined period of time responsive to said second output signal;

wherein the power on said main power bus and any concurrent data operations on said data bus remain uninterrupted and unaffected by said smooth and gradual application and removal of power between said main power bus and said board power bus.

9. The circuit module as specified in claim 8 wherein said control means comprises a switch disposed in cooperating relationship with said cover, wherein said cover forces said switch into a closed state when said cover is brought into shielding relationship with said lever to generate said first output signal, and wherein said switch is forced into an open state when said cover is swingably removed from said shielding relationship with said lever to generate said second output signal.

10. The circuit module as specified in claim 9 wherein said circuit module power control means comprises at least one transistor and at least one power supply monitor, wherein said power supply monitor generates a reset signal following said smooth and gradual application of power between said main power bus and said board power bus to reset said circuitry on said circuit board.

11. The circuit module as specified in claim 10 wherein said circuit module power control means further comprises a high side gate driver coupled to said backplane main power bus when said circuit board is coupled to said backplane for providing a bias voltage to said transistor which is greater than the voltage on said backplane main power bus.

12. The circuit module as specified in claim 11 wherein said circuit module transistor is comprised of a MOSFET having a gate and wherein said high-side gate driver supplies said bias voltage to said gate of said MOSFET when said switch is in said closed state.

13. The circuit module as specified in claim 12 wherein said power control means includes an RC network connected between said switch and said gate of said MOSFET to cause said bias voltage to increase in a smooth and gradual ramped fashion when said switch is in said closed state and to cause said bias voltage to decrease in a smooth and gradual ramped fashion when said switch is in said closed state, thereby applying voltage to said circuitry in a smooth and gradually increasing ramped fashion responsive to said first output signal and removing voltage from said circuitry in a smooth and gradually decreasing ramped fashion responsive to said second output signal.

14. The circuit module as set forth in claim 3 wherein said power control means comprises at least one transistor and a high side gate driver, wherein said high side gate driver is coupled to said back plane main power bus when said circuit board is coupled to said backplane for providing a smooth and gradually increasing bias voltage to said transistor responsive to said first output signal and for providing a smooth and gradually decreasing bias voltage responsive to said second output signal.

15. The circuit module as specified in claim 14 and further, said transistor comprising a MOSFET having a gate, said power control means further comprising an RC network connected to said gate of said MOSFET, said proximity switch being electrically coupled to said high side gate driver and said gate of said MOSFET, wherein said RC network causes said bias voltage to increase in a smooth and gradual ramped fashion responsive to said first output signal, thereby gradually turning said MOSFET on to apply power to said board power bus in a smooth and gradually increasing ramped fashion, and wherein said RC network causes said bias voltage to decrease in a smooth and gradual ramped fashion responsive to said second output signal, thereby gradually turning said MOSFET off to remove power from said board power bus in a smooth and gradually decreasing ramped fashion.

16. The circuit module as specified in claim 15 and further wherein said power control means has at least one power supply monitor for resetting said circuitry following said smooth and gradual ramped application of power between said main power bus and said board power bus.

* * * * *